United States Patent [19]

Yamada

[11] Patent Number: 4,573,019

[45] Date of Patent: Feb. 25, 1986

[54] CURRENT MIRROR CIRCUIT

[75] Inventor: Yuji Yamada, Tokyo, Japan

[73] Assignee: Trio Kabushiki Kaisha, Tokyo, Japan

[21] Appl. No.: 588,818

[22] Filed: Mar. 12, 1984

[30] Foreign Application Priority Data

Mar. 16, 1983 [JP] Japan ............................ 58-36980[U]

[51] Int. Cl.[4] ............................ H03F 3/04; H03F 3/45

[52] U.S. Cl. .................................... 330/257; 330/260; 330/288

[58] Field of Search ........................ 330/257, 288, 260; 323/315, 316

[56] References Cited

U.S. PATENT DOCUMENTS 4,485,301 11/1984 Gontowski, Jr. et al. ..... 330/288 X

*Primary Examiner*—James B. Mullins
*Attorney, Agent, or Firm*—Murray, Whisenhunt and Ferguson

[57] ABSTRACT

A current mirror circuit comprising:

a reference current source; a diode fed with a reference current by the reference current source; a plurality of output transistors commonly biased in base-emitter by a voltage induced across the diode and having loads at respective collectors thereof; and load adjustment transistors disposed between the collector of the respective output transistor and the associated load and biased in the respective base by a common voltage, whereby a plurality of output currents having the same value are obtained in respective loads.

1 Claim, 3 Drawing Figures

CURRENT MIRROR CIRCUIT

FIELD OF THE INVENTION

The present invention relates to an improvement of a current mirror circuit.

PRIOR ART OF THE INVENTION

An example of a current mirror circuit having, e.g., two current outputs among current mirror circuits having a plurality of current outputs is shown in FIG. 1, in which a diode 1 and a current source 2 for supplying a reference current are connected in series between a power terminal $V_{cc}$ and the ground; a base and an emitter of respective output transistors 3 and 4 are individually connected to the cathode of the diode 1 and the power terminal $V_{cc}$; collectors of the output transistors 3 and 4 are used as current output terminals 7 and 8; and loads 5 and 6 are individually connected between those current output terminals 7 and 8 and the ground.

In this circuit, the diode 1 together with the output transistors 3 and 4 constitutes a current mirror circuit. Namely, when a current $I_D$ flows through the diode 1, a voltage such as $$V_D = \frac{kT}{q} \ln\left(\frac{I_D}{I_{S1}}\right) \quad (1)$$

where, k: Boltzmann's Constant ($1.38\times10^{-23}$ J/K)

q: charge of the electron ($1.6\times10^{-19}$ C)

T: temperature $I_{s1}$: reverse saturation current of the diode is induced across the diode 1. At the same time, this voltage $V_D$ is applied as a voltage $V_{BE}$ between the base-emitter of each of the transistors 3 and 4. The following relation is satisfied between the voltage $V_{BE}$ and a collector current $I_C$ as the characteristics of transistors.

$$V_{BE} \approx \frac{kT}{q} \ln\left(\frac{I_c}{I_{s2}}\right) \quad (2)$$

where, $I_{s2}$: reverse saturation current between the base-emitter.

When the characteristics among the diode 1 and the output transistors 3 and 4 are equal, i.e., when $I_{s1}=I_{s2}$, we will have $I_C=I_D$ since $V_D=V_{BE}$ in expressions (1) and (2). That is, the current of the same magnitude as the current flowing through the diode 1 flows as the collector current of the output transistors 3 and 4. The constant current source 2 serves to supply a reference current to the diode. In this way, the reference current is transferred to a plurality of loads 5 and 6 through the diode 1 and the transistors 3 and 4, respectively. Namely, the current of the same magnitude as the reference current is supplied to a plurality of loads, respectively. On the other hand, to match the characteristics of the diode 1 and the transistors 3 and 4, it is realized by, for example, using a similar transistor to the transistors 3 and 4 as the diode 1 and by constituting a diode structure by connecting the base and collector thereof.

In the above-described example, the collector current $I_C$ of the transistor is determined by the voltage $V_{BE}$ between base-emitter and is irrespective of the magnitude of the collector load resistance. In this point of view, since the voltage $V_{BE}$ of the same magnitude is applied between the base-emitter of each of the transistors 3 and 4, it is assumed that the same collector current flows regardless of the magnitudes of resistances of the loads 5 and 6.

However actually, even when the same voltage between base-emitter is applied to the transistors 3 and 4 having the same characteristics, if the voltages between collector-emitter of the transistors 3 and 4 are different, the currents flowing through the transistors 3 and 4 will not become the same value. This is because the collector saturation phenomena in the $I_C$ vs $I_{CE}$ characteristics of the transistors are imperfect, i.e., because of the "Early effect". The different values of the loads 5 and 6 cause the potentials at the current output terminals 7 and 8 to be different; therefore, there is such a drawback that even when the voltages between base-emitter are equal, there occurs the difference in collector current between the output transistors 3 and 4, namely, the difference in the currents flowing through the loads 5 and 6. Although it is possible to match the characteristics of two transistors by making an IC (integrated circuit) using the output transistors 3 and 4 as a pair, there is a case where it is difficult to match the resistance values of the resistors 5 and 6, for instance, 5 being resistor and 6 being a recording head. Therefore, this problem is very important in design of an actual current mirror circuit.

SUMMARY OF THE INVENTION

It is therefore an object of the present invention to provide a current mirror circuit which can allow the current of the same value to flow through a plurality of loads irrespective of the different load values.

It is another specific object of the present invention to provide a voltage input current mirror circuit with low distortion factor having a plurality of output currents.

In accomplishing these and other objects, there has been provided, in accordance with the present invention, a current mirror circuit which includes load adjustment transistors disposed between the collector of the respective output transistors and the associated load and being respectively biased in base by a common voltage.

In a specific embodiment according to the invention, a reference current source comprises an amplifier having a voltage input and current output, the current output being fed to the diode, and the voltage induced across one of the loads is negatively fed back to the input of the amplifier to provide a low distortion between the input voltage and the output currents through the loads.

Further features of the invention, its nature and various advantages will be more apparent upon consideration of the attached drawings and the following detailed description of the invention.

PREFERRED EMBODIMENTS OF THE INVENTION

Figure 2:
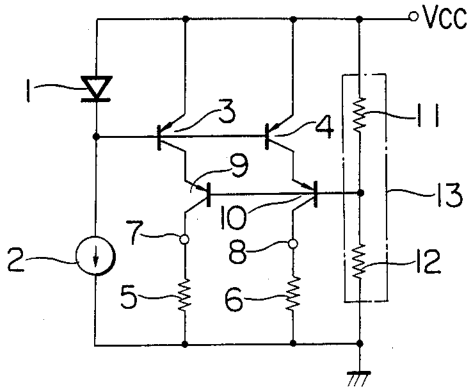
FIG. 2 shows a circuit diagram of an embodiment of a current mirror circuit having a plurality of current outputs according to the present invention.

FIG. 2 is a circuit diagram showing a constitution of an embodiment of the present invention and this embodiment also shows an example of a current mirror circuit having two current outputs.

Figure 1:
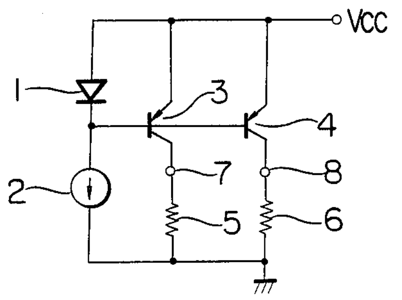
FIG. 1 PRIOR ART
FIG. 1 shows a circuit diagram of a conventional example of a current mirror circuit having a plurality of current outputs.

In this current mirror circuit, load adjustment transistors 9 and 10 in a common-base configuration are connected respectively between each collector of the output transistors 3 and 4 and the respective corresponding current output terminals 7 and 8 in the conventional current mirror circuit shown in FIG. 1. Furthermore, a voltage divider 13 consisting of resistors 11 and 12 connected in series between the power terminal $V_{cc}$ and the ground is further connected, thereby supplying the divided voltage by the voltage divider 13 to the bases of the transistors 9 and 10. Resistance values of the resistors 11 and 12 of this voltage divider 13 are selected to be relatively low, thereby allowing a constant divided voltage to be applied to the bases of the transistors 9 and 10 regardless of the base currents of the transistors 9 and 10.

In the current mirror circuit constituted in such a manner as described above, the base potentials of the transistors 9 and 10 are maintained to the divided voltage of the voltage divider 13.

On the other hand, in the case where the values of the loads 5 and 6 are different and therefore there occurs the difference in potential between the current output terminals 7 and 8, the collector potentials of the transistors 3 and 4 are fixed to the sum potentials of the base potentials of the transistors 9 and 10 to be determined in dependence upon the divided voltage by the voltage divider 13 and the voltages between base-emitter of the transistors 9 and 10. Provided that the characteristics of the transistors 9 and 10 match or static common-emitter current gain $h_{FE}$ of the transistors 9 and 10 are very large, there is hardly a difference in voltage between base-emitter of the transistors 9 and 10. Therefore, even when the values of the loads 5 and 6 are different, the collector potentials of the transistors 3 and 4 are fixed to substantially the equal value, so that the difference in current value flowing through the loads 5 and 6 does not occur.

Thus, it is possible to eliminate the error to be caused due to the Early effect of the output current value.

Next, an example of application of the present invention will be described.

Figure 3:
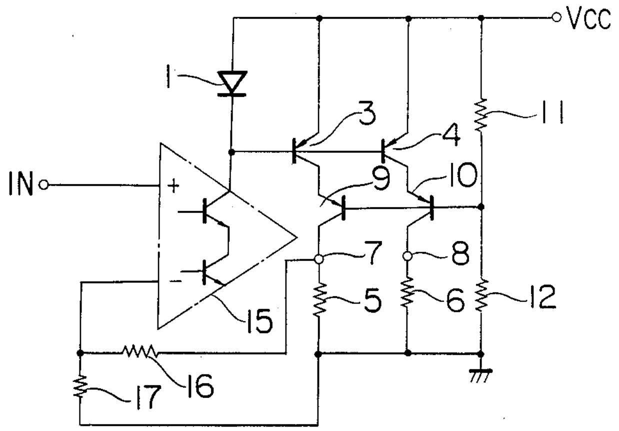
FIG. 3 is a circuit diagram showing an embodiment of a voltage input current mirror circuit according to the present invention.

FIG. 3 shows a voltage input current mirror circuit with low distortion factor constituted by the current mirror circuit of the present invention.

In the circuit constitution of FIG. 3, the constant current source 2 in the current mirror circuit of the present invention of FIG. 2 is substituted by an amplifier 15 and the voltage induced across the load resistor 5 is fed back to one input of the amplifier 15. The input signal voltage applied to the other input terminal IN of the amplifier 15 is converted into the current by the amplifier 15. This current is supplied to the diode 1 as the reference current. As already mentioned in the embodiment of FIG. 2, the reference current is supplied as the output current to the load resistors $R_5$ and $R_6$ in the current mirror circuit constituted by the diode 1 and the transistors 3 and 4. The output current is converted into the voltage by the load resistor 5 and is fed back to the input of the amplifier 15. The output voltage to be developed across the load resistor 5 has a low distortion factor for the input voltage due to this feedback action. Since the load resistor 5 has a constant resistance, the output current flowing through the load resistor 5 also has a low distortion factor. On the other hand, in the constitution of the present invention, even if the values of the load resistors 6 and 5 are different, the currents of the same magnitude flow through the load resistors 5 and 6, so that the output current of a low distortion factor flows through the load resistor 6.

In addition, in the embodiment of the present invention described above, an example in case of two current outputs has been described; however, a similar effect will be otained even in case of two or more current outputs.

As described above, according to the present invention, the load adjustment transistors in a common-base configuration are connected between the respective current output transistors and loads, and the base potentials of the load adjustment transistors are fixed; therefore, there is an effect of elimination of the current difference to be caused due to the Early effect between the output currents of the current mirror circuit.

In addition, there is also such an effect that the constitution for this purpose is realized in a simple configuration.

The present invention should not be limited to the embodiments shown, but can be modified without deviating from the scope of the present invention.

I claim:

1. A current mirror circuit comprising:
   - a reference current source consisting of an amplifier having a voltage input and a current output;
   - diode means fed with said current output from said reference current source;
   - a plurality of output transistors commonly biased in base-emitter by a voltage induced across said diode means and having loads at respective collectors thereof; and
   - load adjustment transistors disposed between the collector of the respective output transistor and the associated load and biased in the respective base by a common voltage, a voltage induced across one of said loads is negatively fed back to the input of said amplifier,
   - whereby a plurality of output currents having the same value being obtained in respective loads.

* * * * *